(12) United States Patent
Kim et al.

(10) Patent No.: US 9,595,966 B2
(45) Date of Patent: Mar. 14, 2017

(54) LEVEL SHIFTER AND NON-VOLATILE MEMORY DEVICE USING THE SAME

(71) Applicant: Magnachip Semiconductor, Ltd., Cheongju-si (KR)

(72) Inventors: Jin Hyung Kim, Goyang-si (KR); Ji Hye Jang, Cheongju-si (KR); Kee Sik Ahn, Hwaseong-si (KR); Sung Bum Park, Seongnam-si (KR); Sung Chun Kang, Seongnam-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 15/054,524

(22) Filed: Feb. 26, 2016

(65) Prior Publication Data

US 2016/0261270 A1    Sep. 8, 2016

(30) Foreign Application Priority Data

Mar. 4, 2015  (KR) .................. 10-2015-0030330

(51) Int. Cl.

| G11C 11/34 | (2006.01) |
|---|---|
| H03K 19/0185 | (2006.01) |
| H02M 3/07 | (2006.01) |
| G11C 16/04 | (2006.01) |
| G11C 16/14 | (2006.01) |
| G11C 16/26 | (2006.01) |

(52) U.S. Cl.
CPC .. *H03K 19/018521* (2013.01); *G11C 16/0408* (2013.01); *G11C 16/14* (2013.01); *G11C 16/26* (2013.01); *H02M 3/07* (2013.01)

(58) Field of Classification Search
CPC ........ H03K 19/018521; G11C 16/0408; G11C 16/14; G11C 16/26; H02M 3/07
USPC ......... 365/185.29, 185.14, 185.18, 129, 191, 365/210.12
See application file for complete search history.

(56) References Cited

U.S. PATENT DOCUMENTS 8,270,234 B1    9/2012  Tang et al.
9,438,235 B2 *  9/2016  Liao ................. H03K 19/00315

* cited by examiner

*Primary Examiner* — Fernando Hidalgo
(74) *Attorney, Agent, or Firm* — NSIP Law (57) ABSTRACT

The level shifter of an embodiment includes a first level shifter configured to output an intermediate signal wherein a high voltage is a positive supply voltage or a positive voltage by inputting an input signal and a low voltage is a negative supply voltage, to an intermediate signal node and an inverted intermediate signal node and a second level shifter configured to output a low voltage to an output terminal and an inverted output terminal by receiving input of the intermediate signal and altering the low voltage to the negative supply voltage or a negative voltage.

22 Claims, 3 Drawing Sheets

LEVEL SHIFTER AND NON-VOLATILE MEMORY DEVICE USING THE SAME

CROSS-REFERENCE TO RELATED APPLICATION(S)

This application claims the benefit under 35 USC 119(a) of Korean Patent Application No. 10-2015-0030330 filed on Mar. 4, 2015 in the Korean Intellectual Property Office, the entire disclosure of which is incorporated herein by reference for all purposes.

BACKGROUND

1. Field

The following description relates to a level shifter. The following description also relates to a level shifter that stably provides a positive voltage (VPP) and a negative voltage (VNN) to a circuit that requires a high voltage for a task like a program operation and an erase operation of a non-volatile memory cell.

2. Description of Related Art

When a voltage of an input signal and a voltage supplied to a circuit are different, a transistor of an input terminal may be always turned ON due to the voltage difference. As a result, a leakage current or a malfunction that interferes with generating output signal normally may occur. A level shifter potentially prevents the malfunction and transmits the input signal by converting a voltage to another, more appropriate voltage level.

A non-volatile memory device uses a voltage that is identical with VDD, or a positive supply voltage, supplied to a semiconductor circuit when reading the memory device. However, when programming and erasing the non-volatile memory device, a positive voltage, generally over 7V, that is greater than VDD, which is generally 3.3V, and the negative voltage, generally less −7V, that is lower than VSS, or a negative supply voltage, which may be a ground voltage, which is generally 0V, is required to remove or inject a charge into a floating gate surrounded with an insulating film. Accordingly, a circuit that applies a voltage to the floating gate is able to output not only VDD and VSS but also the positive voltage VPP and the negative voltage VNN.

A signal controlling program and erase operation uses the source voltage VDD and a ground voltage level, thereby generating different voltage from the positive voltage VPP and the negative voltage VNN that are supplied to a power supply of the non-volatile memory device. Accordingly, the circuit applying voltage to the floating gate uses the level shifter to prevent a malfunction that is generated due to a voltage difference of the input signal.

A level shifter of an alternative technology includes a body or bulk portion of the transistor that is connected to an output terminal, such that the body or bulk portion is connected to the power supply terminal or a ground terminal. When a positive voltage VPP is supplied to the power supply terminal and the negative voltage VNN is supplied to the output terminal, the voltage difference supplied to a drain and body of the transistor becomes the difference between the difference of the positive voltage VPP and the negative voltage VNN. By contrast, when the negative voltage VNN is supplied to the ground terminal and the positive voltage VPP is supplied to the output terminal, a voltage difference supplied to the drain and the body of the transistor becomes a difference between the positive voltage VPP and the negative voltage VNN. Herein, the drain and body form a PN junction, so when a difference between the positive voltage VPP and the negative voltage VNN is larger than the drain-body breakdown voltage, a breakdown phenomenon is generated.

Accordingly, the level shifter according to an alternative technology has an issue of a substantial increase of consumption current and is also unable to normally output a voltage of an output terminal because the drain-body breakdown phenomenon is generated when a voltage difference supplied to the power supply terminal and the ground terminal is larger than the drain-body breakdown voltage.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a level shifter includes a first level shifter configured to output an intermediate signal between a high voltage and a low voltage, wherein the high voltage is a positive supply voltage or a positive voltage and the low voltage is a negative supply voltage, to an intermediate signal node and an inverted intermediate signal node, and a second level shifter configured to receive the intermediate signal and output a low voltage, by converting the intermediate signal into a negative supply voltage or a negative voltage, through an output terminal and an inverted output terminal, wherein the second level shifter includes a P-type transistor with a body connected to the intermediate signal node or the inverted intermediate signal node.

The level shifter may include a first pull-down circuit configured to apply the negative supply voltage to the intermediate signal node or inverted intermediate signal node according to an input signal, and a first pull-up circuit configured to apply the positive supply voltage or positive voltage to the inverted intermediate signal node or intermediate signal node according to the voltage of the intermediate signal node and the voltage of the inverted intermediate signal node.

The first pull-down circuit may include a first N-type transistor with a source and body connected to a ground terminal, a gate connected to an inverted input node, and a drain connected to the intermediate signal node, and a second N-type transistor with a source and body connected to the ground terminal, a gate connected to an input terminal, and a drain connected to the inverted intermediate signal node.

The first pull-up circuit may include a first P-type transistor with a source and body connected to a power supply terminal, a gate connected to the inverted intermediate signal node, and a drain connected to the intermediate signal node, and a second P-type transistor with a source and body connected to a power supply terminal, a gate connected to the intermediate signal node, and a drain connected to the intermediate signal node.

The second level shifter may include a second pull-up circuit configured to apply the positive supply voltage or the positive voltage to the output terminal and the inverted output terminal according to the voltage of the intermediate signal node and the voltage of the inverted intermediate signal node, a second pull-down circuit configured to apply the negative supply voltage or the negative voltage to the inverted output terminal or output terminal according to the voltage of the output terminal and the voltage of the inverted output terminal, and a protector located between the second pull-up circuit and the second pull-down circuit and connected to the output terminal and the inverted output terminal.

The second pull-up circuit may include a third P-type transistor configured to apply the positive supply voltage or the positive voltage to the inverted output terminal according to the voltage of the intermediate signal node, and a fourth P-type transistor configured to apply the positive supply voltage or the positive voltage to the output terminal according to the voltage of the inverted intermediate signal node.

The second pull-down circuit may include a third N-type transistor configured to apply the negative supply voltage or the negative voltage to the inverted output terminal according to the voltage of the output terminal, and a fourth N-type transistor configured to apply the negative supply voltage or the negative voltage according to the voltage of the inverted output terminal.

The protector may include a fifth P-type transistor connected between the second pull-up circuit and the inverted output terminal and having a body connected to the inverted intermediate signal node and a gate connected to a first control signal, and a sixth P-type transistor connected between the second pull-up circuit and the output terminal and having a body connected to the intermediate signal node and a gate connected to a second control signal.

The protector may include a fifth N-type transistor connected between the second pull-down circuit and the inverted output terminal and having a gate connected to the third control signal and a body connected to its source, and a sixth N-type transistor connected between the second pull-down circuit and the output terminal circuit and having a gate connected to the third control signal and a body connected to its source.

The first level shifter may supply the negative supply voltage to the intermediate node in response to the voltage of the output terminal being the negative voltage, and may supply the negative supply voltage to the inverted intermediate signal node in response to the voltage of the inverted output terminal being the negative voltage.

The first and second control signals may be supplied with the negative supply voltage in response to the positive voltage being supplied to the power supply terminal of the second level shifter and the negative voltage being supplied to the ground terminal.

The first control signal may be supplied with the positive supply voltage in response to the positive supply voltage being supplied to the power supply terminal of the second level shifter and in response to the inverted output terminal outputting the negative supply voltage.

The second control signal may be supplied with the positive supply voltage in response to the second level shifter power supply terminal being supplied with positive supply voltage and in response to the output terminal outputting the negative supply voltage.

The fifth N-type transistor and the sixth N-type transistor may include a deep-well in the lower body circuit.

The third control signal may be supplied with the positive supply voltage in response to the negative supply voltage being supplied to the ground terminal of the second level shifter.

The third control signal may be supplied with the negative supply voltage in response to the negative voltage being supplied to the ground terminal of the second level shifter.

The positive voltage may be greater than the positive supply voltage, and the negative voltage may be less than the negative supply voltage.

The first level shifter may be connected to a power supply terminal and a first ground terminal and the second level shifter may be connected to the power supply terminal and a second ground terminal.

The power supply terminal may be supplied with the positive supply voltage or the positive voltage, the first ground terminal may be supplied with the negative supply voltage, and the second ground terminal may be supplied with the negative supply voltage or the negative voltage.

In another general aspect, a non-volatile memory device includes a level shifter including a first level shifter configured to output an intermediate signal between a high voltage and a low voltage, wherein the high voltage is a positive supply voltage or a positive voltage and the low voltage is a negative supply voltage, to an intermediate signal node and an inverted intermediate signal node, and a second level shifter configured to receive the intermediate signal and output a low voltage, by converting the intermediate signal into a negative supply voltage or a negative voltage, through an output terminal and an inverted output terminal, wherein the second level shifter includes a P-type transistor with a body connected to the intermediate signal node or the inverted intermediate signal node, a charge pump configured to provide a positive supply voltage or a positive voltage to the level shifter power supply terminal, a controller configured to control the level shifter and the charge pump, and a non-volatile memory cell configured to conduct reading, programming and erasing according to the output of the level shifter.

The charge pump may provide the positive supply voltage during reading.

The charge pump may provide the positive voltage during programming and erasing.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Certain embodiments are now described in greater detail with reference to the accompanying drawings.

In the following description, the same drawing reference numerals are used for the same elements even in different drawings. The matters defined in the description, such as detailed construction and elements, are provided to assist in a comprehensive understanding of the present examples. Accordingly, it is apparent that the embodiments are able to be carried out without those specifically defined matters. Also, well-known functions or constructions are not described in detail since they would obscure the embodiments with unnecessary detail.

While the expressions such as "first" or "second" are potentially used to refer to various elements, the elements are not to be limited by the expressions. The expressions are used only for the purpose of distinguishing one element from the other.

The expressions are used herein only for the purpose of explaining specific embodiments and not to be limiting. An expression in singular form encompasses plural meaning, unless otherwise specified. Throughout the description, the expression "comprise" or "have" is used only to designate the existence of a characteristic, number, step, operation, element, component or a combination thereof which are described herein, but not to preclude the possibility of existence of one or more of the other characteristics, numbers, steps, operations, elements, components or combinations of these or additional aspects.

The following description is merely exemplary in nature and is in no way intended to limit the disclosure, its application, or uses. For purposes of clarity, the same reference numbers are used in the drawings to identify similar elements. As used herein, the phrase at least one of A, B, and C is to be construed to mean a logical structure (A or B or C), using a non-exclusive logical or. It is also to be understood that steps within a method are potentially executed in a different order without altering the principles of the present examples.

The level shifter of an embodiment prevents the drain-body breakdown phenomenon by applying VSS to a body of a transistor connected to an output terminal.

A non-volatile memory device of an embodiment implements programming and erasing without leakage current by preventing the drain-body breakdown phenomenon. For example, the memory device is able to avoid the drain-body breakdown phenomenon by using such a level shifter.

Figure 1:
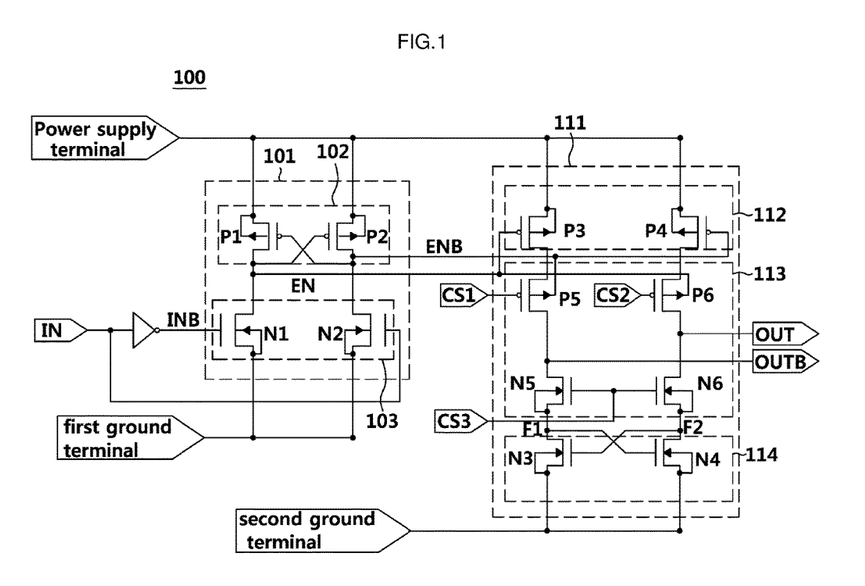
FIG. 1 is a diagram illustrating a level shifter circuit according to an embodiment.

FIG. 1 is a diagram illustrating a level shifter 100 circuit according to an embodiment.

First, the following description discloses various features of a level shifter 100 according to an embodiment.

As illustrated in the example of FIG. 1, a level shifter 100 of an embodiment includes a first level shifter 101 configured to output an intermediate signal according to an input signal and to output VDD or a positive voltage VPP having a high voltage according to the intermediate signal and a second level shifter 111 configured to output VSS and a negative voltage VNN having a low voltage.

The first level shifter 101 includes a first pull-down unit or first pull-down circuit 103 that applies a first ground terminal voltage to an intermediate signal node EN or an inverted intermediate signal node ENB and a second pull-up unit or second pull-up circuit 102 that applies a voltage of a power supply terminal to the intermediate signal node EN or the inverted intermediate signal node ENB.

The first pull-down circuit 103 includes a first N-type transistor N1, wherein a source and body are connected with a first ground terminal, a gate is connected to an inverted input node INB, and a drain is connected to the intermediate signal node EN. The first pull-down circuit 103 also includes a second N-type transistor N2, wherein the source and body are connected to a first ground terminal, a gate connected to an input terminal IN, and the drain is connected to the inverted intermediate signal node ENB.

A first pull-up unit or first pull-up circuit 102 includes a first P-type transistor P1, wherein the source and body are connected to a power supply terminal, a gate is connected to the inverted intermediate signal node ENB, and the drain is connected to the intermediate signal node EN and a second P-type transistor P2, wherein the source and body are connected to a power supply terminal, a gate is connected to the intermediate signal node EN, and the drain is connected to the inverted intermediate signal node ENB.

The second level shifter 111 includes a second pull-up unit or second pull-up circuit 112 that applies a voltage of a power supply terminal to an output terminal OUT or an inverted output terminal OUTB based on an intermediate signal output by the first level shifter 101, a second pull-down unit or second pull-down circuit 114 configured to apply a voltage of a second ground terminal to an output terminal OUT or an inverted output terminal OUTB, and a protector 113 connected between the second pull-up circuit 112 and the second pull-down circuit 114.

The second pull-up circuit 112 includes a third P-type transistor P3, wherein the source and body are connected to a power supply terminal and a gate is connected to the intermediate signal node EN, and a fourth P-type transistor P4, wherein the source and body are connected to a power supply terminal and a gate is connected to the inverted intermediate signal node ENB, respectively.

The protector 113 includes a fifth P-type transistor P5, wherein the source is connected to the drain of the third P-type transistor P3, a gate is connected to a first control signal CS1, the drain is connected to an inverted output terminal OUTB. The protector 113 also includes a sixth P-type transistor P6, wherein the source is connected to the drain of the fourth P-type transistor P4, a body is connected to the intermediate signal node EN, a gate is connected to a second control signal CS2, the drain is connected to an output terminal OUT. The protector 113 also includes a fifth N-type transistor N5 wherein the drain is connected to an inverted output terminal OUTB, a gate is connected to a third control signal CS3, the drain is connected to an inverted output terminal OUTB, a gate is connected to a third control signal CS3, and its body is connected to its source. The protector 113 also includes a sixth N-type transistor N6, wherein the drain is connected to an output terminal OUT, a gate is connected to a third control signal CS3, and its body is connected to its source.

Particularly, according to an embodiment, fifth and sixth P-type transistors P5, P6 possibly prevent the drain-body breakdown phenomenon by a body connected to the intermediate signal node EN and the inverted intermediate signal node ENB. Hereinafter, the following description illustrates in more detail regarding operations referring to FIG. 2.

The second pull-down circuit 114 includes a third N-type transistor N3, wherein the body and source are connected to a second ground terminal, the drain is connected to the source of the fifth N-type transistor N5, and a gate is connected to the source of the sixth N-type transistor N6. The second pull-down circuit 114 also includes a fourth N-type transistor N4, wherein the body and the source are connected to a second ground terminal, a drain is connected to the source of the sixth N-type transistor N6, and a gate is connected to the source of the fifth N-type transistor N5.

Figure 2:
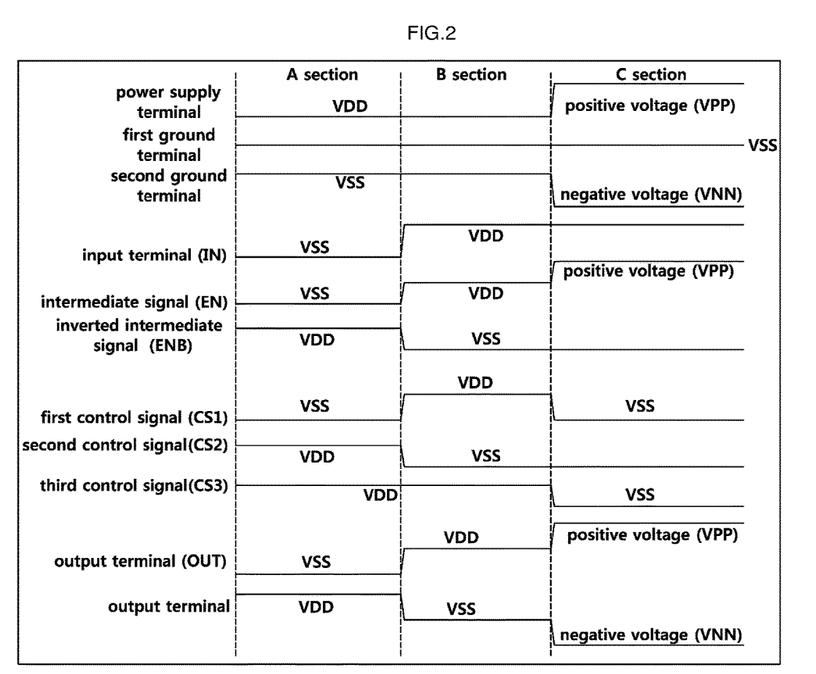
FIG. 2 is a diagram illustrating signals according to an embodiment.

FIG. 2 is a diagram illustrating signals according to an embodiment. Referring to the examples of FIG. 1 and FIG. 2, detailed operation of a level shifter 100 of an embodiment is explained.

First, a particular operation of an A section in which VDD is supplied to a power supply terminal and VSS is supplied to a first and second ground terminal is explained further.

When an input signal is supplied to VSS, the first pull-down circuit 103 applies VSS to the intermediate signal node EN in which the first N-type transistor N1 is turned ON. The first pull-up circuit 102 applies VDD to the inverted intermediate signal node ENB, because a second P-type transistor P2 is turned ON by VSS of the intermediate signal node EN. In this example, the second N-type transistor N2 is turned OFF because VSS is supplied to a gate and the first P-type transistor P1 is turned OFF because a VDD is supplied to a gate. Thus, when the second N-type transistor N2 and the first P-type transistor P1 are turned OFF, a route with leakage current is blocked.

When the intermediate signal node EN becomes VSS, a third P-type transistor P3 in the second pull-up circuit 112 is turned ON. Additionally, a fifth P-type transistor P5 is turned ON in the protector 113 because a VSS is supplied to a first control signal CS1. An inverted output terminal OUTB is electrically connected to a power supply terminal through the third and fifth P-type transistors P3, P5. Accordingly, the inverted output terminal outputs the VDD.

The protector 113 electrically connects an output terminal OUT and an inverted output terminal OUTB to a pull-down terminal when a fifth and a sixth N-type transistors N5, N6 are turned ON because VDD is supplied to a third control signal CS3. The fourth N-type transistor N4 of a pull-down circuit is turned ON by VDD supplied to an inverted output terminal OUTB. The output terminal OUT is electrically connected with a second ground terminal through the fourth and sixth N-type transistors N4, N6. Herein the output terminal OUT is electrically connected to a gate of the third N-type transistor N3 by the sixth N-type transistor N6. Accordingly, VSS of the output terminal OUT blocks a route with a leakage current by turning the third N-type transistor N3 OFF.

When the inverted intermediate signal node ENB becomes VDD, a fourth P-type transistor P4 is turned off and blocks the route with a leakage current. Herein, the protector 113 turns OFF a sixth P-type transistor P6 as VDD is supplied to a second control signal CS2. Herein, even if the sixth P-type transistor P6 is turned ON, there is no electrical effect on an output terminal OUT. However, when noise occurs, the inverted intermediate signal node ENB voltage transitions, and accordingly the fourth P-type transistor P4 could be turned ON. When a sixth P-type transistor P6 is turned OFF, the fourth P-type transistor P4 connection is blocked accordingly, which reduces a possibility of malfunction.

Next, referring to an operation of section B, when an input signal is transited from VSS to VDD based on a principle identical with operation of section A, the first level shifter 101 outputs VDD to the intermediate signal node EN and VSS to the inverted intermediate signal node ENB. The second pull-up circuit 112 applies VDD to an output terminal OUT as a fourth P-type transistor P4 is turned ON. The protector 113 includes a fifth P-type transistor P5 configured to be turned OFF as VDD is supplied to a first control signal CS1 and a sixth P-type transistor P6 configured to be turned ON as VSS is supplied to a second control signal CS2. Additionally, the protector 113 electrically connects the second pull-down circuit 114 to the output terminal OUT and the inverted output terminal OUTB as VDD is supplied to a third control signal CS3. The second pull-down circuit 114 applies VSS to the inverted output terminal through the third N-type transistor N3 that is turned ON.

FIG. 2 also subsequently illustrates a particular operation of section C in which VPP is supplied to a power supply terminal, VSS is supplied to a first ground terminal, VNN is supplied to a second ground terminal, and VDD is supplied to input terminal IN.

A more detailed explanation of operation of the first level shifter 101, the second pull-up circuit 112 and the second pull-down circuit 114 in section C is presented in conjunction with the description of operation of the protector 113 illustrated above, and accordingly a more detailed explanation is omitted subsequently.

When VPP is supplied to a power supply terminal and VNN is supplied to a second ground terminal, the protector 113 is operated as a transmission gate. The protector 113 prevents a voltage supplied to the second pull-up circuit 112 and the second pull-down circuit 114 from being higher than a voltage supplied to first, second, and third control signals CS1, CS2, CS3. Here, VSS is supplied to the first, second, and third control signals CS1, CS2, CS3. Accordingly, the protector 113 prevents the drain-body breakdown phenomenon in the second pull-up circuit 112 and the second pull-down circuit 114.

Referring to operation of the protector 113 in further detail, VSS is supplied to a gate of a fifth P-type transistor P5. The fifth P-type transistor P5 is turned OFF when the source voltage is lower than VSS voltage with Vth added. Accordingly, the fifth P-type transistor P5 prevents the source voltage from becoming less than VSS-Vth. The drain of the third P-type transistor P3 is connected to the source of the fifth P-type transistor P5, so the drain voltage does not go lower than VSS-Vth. Accordingly, the drain-body voltage of the third P-type transistor P3 becomes VPP-VSS-Vth.

Based on the same principle, the sixth P-type transistor P6, the fifth N-type transistor N5 and the sixth N-type transistor N6 reduce the drain-body voltage of the second pull-up circuit 112 and the second pull-down circuit 114.

The drain of the fifth P-type transistor P5 is connected to the inverted output terminal OUTB and accordingly, a negative voltage VNN is supplied. In this example, when the negative voltage VNN is supplied to the inverted output terminal OUTB, the inverted intermediate signal node ENB is VSS, and accordingly the drain-body voltage of the fifth P-type transistor P5 is VNN-VSS. Based on the same principle, when VNN is supplied to the output terminal OUT, the drain-body voltage of the sixth P-type transistor P6 is reduced to VNN-VSS.

The drain of the fifth N-type transistor N5 is connected to the inverted output terminal OUTB, and accordingly the positive voltage VPP is supplied. In this example, the source voltage of the fifth N-type transistor N5 increases by as much as NSS-Vth in the negative voltage VNN as aforementioned. The body of the fifth N-type transistor N5 is connected to the source, and thereby the body voltage increases according to the source voltage. Accordingly, although a positive voltage VPP is supplied to the drain of the fifth N-type transistor N5, the drain-body voltage decreases to VPP−VSS+Vth. Based on the same principle, when a positive voltage VPP is supplied to the output terminal OUT, the drain-body voltage of the sixth N-type transistor N6 decreases to VPP−VSS+Vth.

When a negative voltage VNN is supplied to an inverted output terminal OUTB, the fourth N-type transistor N4 is turned OFF, and thereby the F1 node becomes a floating node. Additionally, the body of the sixth N-type transistor N6 becomes a floating node because it is connected to the F1 node. When the body of the transistor operates with a floating node, there is a possibility of a malfunction due to body effect and parasitic BJT (Lateral Bipolar Junction Transistor) operation. Based on the same principle, when the negative voltage VNN is supplied to the output terminal OUT, F2 node becomes a floating node, and accordingly the fifth N-type transistor N5 has a possibility of malfunction. Accordingly, it is preferable for the fifth N-type transistor N5 and the sixth N-type transistor N6 to use a transistor with an N-well formed so that the body is not electrically influenced by other devices.

As illustrated in FIG. 2, a level shifter of an embodiment includes a power supply terminal supplied with VDD or positive voltage VPP, a first ground terminal supplied with VSS, and a second ground terminal supplied with VSS or a negative voltage VNN. By jointly connecting the power supply terminal in this manner, a high signal voltage of the first level shifter 101 and the second level shifter 111 is maintained to be the same. Additionally, VDD and VSS are output when reading a non-volatile memory cell according to a voltage supplied to the power supply terminal. Accordingly, the first and second ground terminal and positive voltage VPP and negative voltage VNN are able to be output when programming and erasing.

Figure 3:
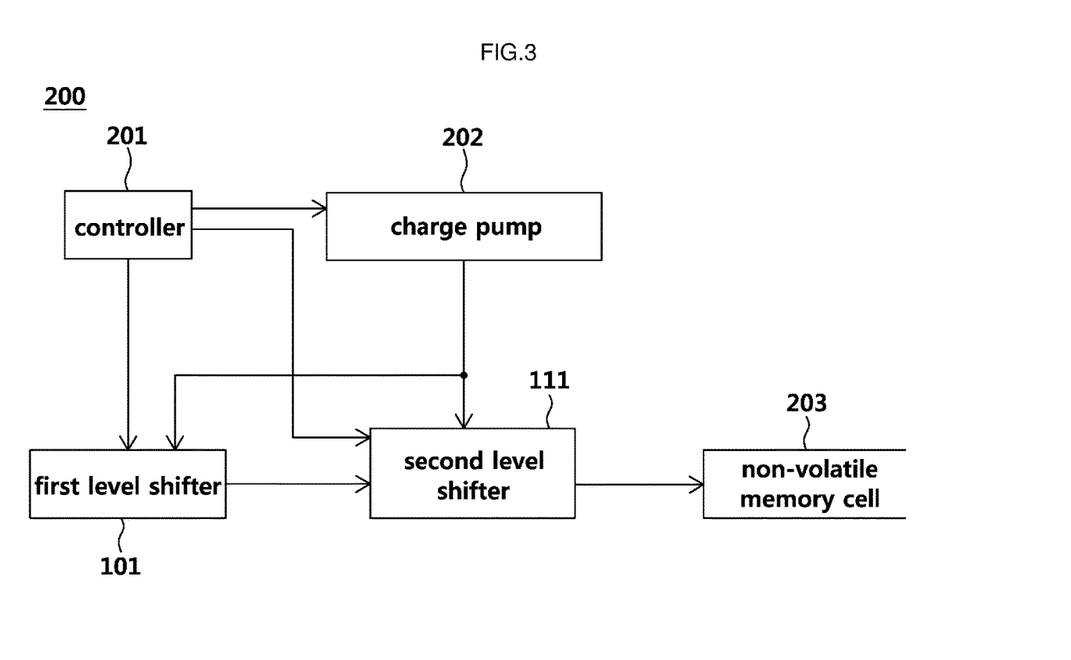
FIG. 3 is a diagram illustrating a non-volatile memory device that includes a level shifter according to an embodiment.

FIG. 3 is a block diagram illustrating a non-volatile memory device 200 including a level shifter.

First, in the example of FIG. 3, referring to the non-volatile memory device 200 structure, a controller 201 is connected to an input terminal of the first level shifter 101, an input terminal of a charge pump 202, and an input terminal of the second level shifter 111, respectively. The charge pump 202 is connected to the first level shifter 101 and the second level shifter 111, respectively. The first level shifter 101 is connected to the input terminal of the second level shifter 111. The second level shifter 111 is connected to an input terminal of a non-volatile memory cell 203.

Referring to the operation of such respective features, the controller 201 determines reading, programming and erasing operations and then generates control signals according to the respective operations. The controller 201 transmits a control signal so that the charge pump 202 provides VDD and VSS during reading and the charge pump 202 provides a positive voltage VPP and a negative voltage VNN during programming and erasing. Additionally, as illustrated in the example of FIG. 2, the controller 201 generates an input signal IN and transmits a corresponding signal to the first level shifter 101 and generates the first, second and third control signals CS1, CS2, CS3 to transmit an appropriate signal to the second level shifter 111.

The charge pump 202 generates a positive voltage VPP and a negative voltage VNN by receiving input including VDD and VSS. The charge pump applies VDD and VSS to the first level shifter 101 and the second level shifter 111 during reading according to the control signal of the controller 201 and generates a positive voltage VPP and a negative voltage VNN and applies such voltages to the second level shifter 111.

As illustrated in the examples of FIG. 1 and FIG. 2, the first level shifter 101 and the second level shifter 111 output a voltage necessary for reading, programming and erasing according to the voltage supplied by the control signal of the controller 201 and the charge pump 202.

The non-volatile memory cell 203 stores or erase information through outputting an electric signal according to the charge amount injected to a floating gate during reading according to the voltage output by the second level shifter 111 and by injecting or ejecting charge to the floating gate during programming and erasing.

In examples, the non-volatile memory device 200 prevents the drain-body breakdown phenomenon when a positive voltage VPP and a negative voltage VNN that are used for programming and erasing of the non-volatile memory cell 203 are supplied to the power supply terminal and the ground terminal. Furthermore, the non-volatile memory device 200 applies the positive voltage VPP and the negative voltage VNN to the floating gate of the non-volatile memory cell 203 without a leakage current.

The apparatuses, units, modules, devices, and other components illustrated in FIGS. 1-3 that perform the operations described herein with respect to FIGS. 1-3 are implemented by hardware components. Examples of hardware components include controllers, sensors, generators, drivers, memories, comparators, arithmetic logic units, adders, subtractors, multipliers, dividers, integrators, and any other electronic components known to one of ordinary skill in the art. In one example, the hardware components are implemented by computing hardware, for example, by one or more processors or computers. A processor or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one example, a processor or computer includes, or is connected to, one or more memories storing instructions or software that are executed by the processor or computer. Hardware components implemented by a processor or computer execute instructions or software, such as an operating system (OS) and one or more software applications that run on the OS, to perform the operations described herein with respect to FIGS. 1-3. The hardware components also access, manipulate, process, create, and store data in response to execution of the instructions or software. For simplicity, the singular term "processor" or "computer" may be used in the description of the examples described herein, but in other examples multiple processors or computers are used, or a processor or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-3 that perform the operations described herein with respect to FIGS. 1-3 are performed by a processor or a computer as described above executing instructions or software to perform the operations described herein.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner and providing the instructions or software and any associated data, data files, and data structures to a processor or computer so that the processor or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processor or computer.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A level shifter, comprising:
a first level shifter configured to output an intermediate signal as a selected one of a high voltage from a power supply terminal and a first low voltage, wherein the high voltage is a first positive supply voltage or a positive voltage and the first low voltage is a first negative supply voltage, to an intermediate signal node and output the not selected one of the high voltage and the first low voltage to an inverted intermediate signal node; and
a second level shifter configured to output the high voltage, based on the intermediate signal, through one of an output terminal and an inverted output terminal, and output a second low voltage through the other one of the output terminal and the inverted output terminal,
wherein the second low voltage is a second negative supply voltage or a negative voltage, and
wherein the second level shifter comprises a P-type transistor with a body connected to the intermediate signal node or the inverted intermediate signal node.

2. The level shifter of claim 1, wherein the first level shifter comprises a first pull-down circuit configured to output the first negative supply voltage to the intermediate signal node or inverted intermediate signal node according to an input signal provided at an input signal node; and
a first pull-up circuit configured to output the high voltage to the inverted intermediate signal node or the intermediate signal node according to whether the first negative supply voltage is output to the intermediate signal node or the inverted intermediate signal node.

3. The level shifter of claim 2, wherein the first pull-down circuit comprises:
a first N-type transistor with a source and body connected to a first ground terminal, a gate connected to an inverted input signal node, and a drain connected to the intermediate signal node; and
a second N-type transistor with a source and body connected to the first ground terminal, a gate connected to the input signal node, and a drain connected to the inverted intermediate signal node.

4. The level shifter of claim 2, wherein the first pull-up circuit comprises:
a first P-type transistor with a source and body connected to the power supply terminal, a gate connected to the inverted intermediate signal node, and a drain connected to the intermediate signal node; and
a second P-type transistor with a source and body connected to the power supply terminal, a gate connected to the intermediate signal node, and a drain connected to the inverted intermediate signal node.

5. The level shifter of claim 1, wherein the second level shifter comprises:
a second pull-up circuit configured to output the high voltage to the output terminal or the inverted output terminal according to the intermediate signal node and the inverted intermediate signal node;
a second pull-down circuit configured to output the second low voltage to the inverted output terminal or the output terminal according to whether the high voltage is output to the output terminal or the inverted output terminal; and
a protector connecting the second pull-up circuit and the second pull-down circuit to the output terminal and the inverted output terminal.

6. The level shifter of claim 5, wherein the second pull-up circuit comprises:

a third P-type transistor configured to output the high voltage to the inverted output terminal according to the intermediate signal node; and a fourth P-type transistor configured to output the high voltage to the output terminal according to the inverted intermediate signal node.

7. The level shifter of claim 5, wherein the second pull-down circuit comprises:

a third N-type transistor configured to output the second low voltage to the inverted output terminal according to whether the high voltage is output to the output terminal; and a fourth N-type transistor configured to output the second low voltage according to whether the high voltage is output to the inverted output terminal.

8. The level shifter of claim 5, wherein the protector comprises:

a fifth P-type transistor connected between the second pull-up circuit and the inverted output terminal and having a body connected to the inverted intermediate signal node and a gate connected to a first control signal; and a sixth P-type transistor connected between the second pull-up circuit and the output terminal and having a body connected to the intermediate signal node and a gate connected to a second control signal.

9. The level shifter of claim 8, wherein the protector comprises:

a fifth N-type transistor connected between the second pull-down circuit and the inverted output terminal and having a gate of the fifth N-type transistor connected to a third control signal and a body of the fifth N-type transistor connected to a source of the fifth N-type transistor; and a sixth N-type transistor connected between the second pull-down circuit and the output terminal circuit and having a gate of the sixth N-type transistor connected to the third control signal and a body of the sixth N-type transistor connected to a source of the sixth N-type transistor.

10. The level shifter of claim 8, wherein the level shifter is configured to supply the first negative supply voltage to the intermediate signal node in response to the voltage of the output terminal being the negative voltage, and supply the first negative supply voltage to the inverted intermediate signal node in response to the voltage of the inverted output terminal being the negative voltage.

11. The level shifter of claim 8, wherein the negative voltage is output to the output terminal in response to the first and second control signals being supplied with a third negative supply voltage, the positive voltage being supplied to the power supply terminal and the negative voltage being supplied to a second ground terminal.

12. The level shifter of claim 8, wherein, in response to the first control signal being supplied with a second positive supply voltage, and the first positive supply voltage being supplied to the power supply terminal, the first positive supply voltage is output to the output terminal and the second negative supply voltage is output to the inverted output terminal.

13. The level shifter of claim 8, wherein in response to the second control signal being supplied with a second positive supply voltage and the power supply terminal being supplied with the first positive supply voltage, the second negative supply voltage is output to the output terminal.

14. The level shifter of claim 9, wherein the fifth N-type transistor and the sixth N-type transistor comprise a deep-well in the lower body circuit.

15. The level shifter of claim 9, wherein the protector is configured to turn on the fifth and sixth N-type transistors in response to the third control signal being supplied with the positive supply voltage and the negative supply voltage being supplied to a second ground terminal.

16. The level shifter of claim 9, wherein the protector is configured to turn on the fifth and sixth N-type transistors in response to the third control signal being supplied with the negative supply voltage and the negative voltage being supplied to a second ground terminal.

17. The level shifter of claim 1, wherein the positive voltage is greater than the positive supply voltage, and the negative voltage is less than the negative supply voltage.

18. The level shifter of claim 1, wherein the first level shifter is connected to the power supply terminal and a first ground terminal and the second level shifter is connected to the power supply terminal and a second ground terminal.

19. The level shifter of claim 18, wherein the power supply terminal is supplied with the positive supply voltage or the positive voltage, the first ground terminal is supplied with the negative supply voltage, and the second ground terminal is supplied with the negative supply voltage or the negative voltage.

20. A non-volatile memory device, comprising:

a level shifter comprising a first level shifter configured to output an intermediate signal as a selected one of a high voltage and a first low voltage, wherein the high voltage is a positive supply voltage or a positive voltage and the first low voltage is a negative supply voltage, to an intermediate signal node and output the not selected one of the high voltage and the first low voltage to an inverted intermediate signal node, and a second level shifter configured to output the high voltage, based on the intermediate signal, through one of an output terminal and an inverted output terminal, and output a second low voltage through the other one of the output terminal and the inverted output terminal, wherein the second low voltage is a second negative supply voltage or a negative voltage, and wherein the second level shifter comprises a P-type transistor with a body connected to the intermediate signal node or the inverted intermediate signal node;

a charge pump configured to provide the positive supply voltage or the positive voltage to the level shifter power supply terminal;

a controller configured to control the level shifter and the charge pump; and a non-volatile memory cell configured to conduct reading, programming and erasing according to the output of the level shifter.

21. The non-volatile memory device of claim 20, wherein the non-volatile memory cell is configured to conduct reading in response to the charge pump providing the positive supply voltage.

22. The non-volatile memory device of claim 20, wherein the non-volatile memory cell is configured to conduct programming and erasing in response to the charge pump providing the positive voltage.

* * * * *